(12) United States Patent
Lin

(10) Patent No.: US 12,713,682 B2
(45) Date of Patent: Aug. 18, 2026

(54) SEMICONDUCTOR STRUCTURE WITH NITRIDE CAPS

(71) Applicant: Micron Technology, Inc., Boise, ID (US)

(72) Inventor: Yenting Lin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 425 days.

(21) Appl. No.: 18/500,275

(22) Filed: Nov. 2, 2023

(65) Prior Publication Data

US 2024/0178297 A1 May 30, 2024

Related U.S. Application Data

(60) Provisional application No. 63/428,909, filed on Nov. 30, 2022.

(51) Int. Cl.
*H10D 64/62* (2025.01)
*H10D 64/01* (2025.01)
*H10D 64/66* (2025.01)

(52) U.S. Cl.
CPC ............. *H10D 64/62* (2025.01); *H10D 64/01* (2025.01); *H10D 64/66* (2025.01)

(58) Field of Classification Search
CPC ........ H10D 64/62; H10D 64/01; H10D 64/66; H10W 20/074; H10B 12/482
See application file for complete search history.

(56) References Cited

U.S. PATENT DOCUMENTS 5,893,734 A * 4/1999 Jeng ........................ H10B 12/05 257/E21.654
6,329,276 B1 * 12/2001 Ku ..................... H10D 30/0212 438/669
9,761,559 B1 9/2017 Shih
2004/0065958 A1 * 4/2004 Hachisuka ............. H10B 12/37 257/E21.585
2018/0005984 A1 1/2018 Yu
2019/0355672 A1 * 11/2019 Fujita .................. H10W 20/056
2022/0139885 A1 5/2022 Hu
2023/0317665 A1 10/2023 Pan

* cited by examiner

*Primary Examiner* — Sitaramarao S Yechuri
(74) *Attorney, Agent, or Firm* — Brooks, Cameron & Huebsch, PLLC

(57) ABSTRACT

Methods, apparatuses, and systems related to semiconductor structure with nitride caps are described. An example apparatus includes a semiconductor structure comprising a patterned material comprising active areas, a metal material on a surface of each active area. The patterned material further includes a second conductive material, a third conductive material, and a first dielectric material, and a nitride material adjacent each vertical side of the second conductive material, the third conductive material, and the first dielectric material. The apparatus includes a second nitride material on a first horizontal surface of each nitride material and each first dielectric material, and a second metal material.

18 Claims, 10 Drawing Sheets

SEMICONDUCTOR STRUCTURE WITH NITRIDE CAPS

PRIORITY INFORMATION

This application claims the benefit of U.S. Provisional Application No. 63/428,909, filed on Nov. 30, 2022, the contents of which are incorporated herein by reference.

TECHNICAL FIELD

The present disclosure relates generally to semiconductor devices and methods, and more particularly to a semiconductor structure with nitride caps.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

DETAILED DESCRIPTION

Figure 1A:
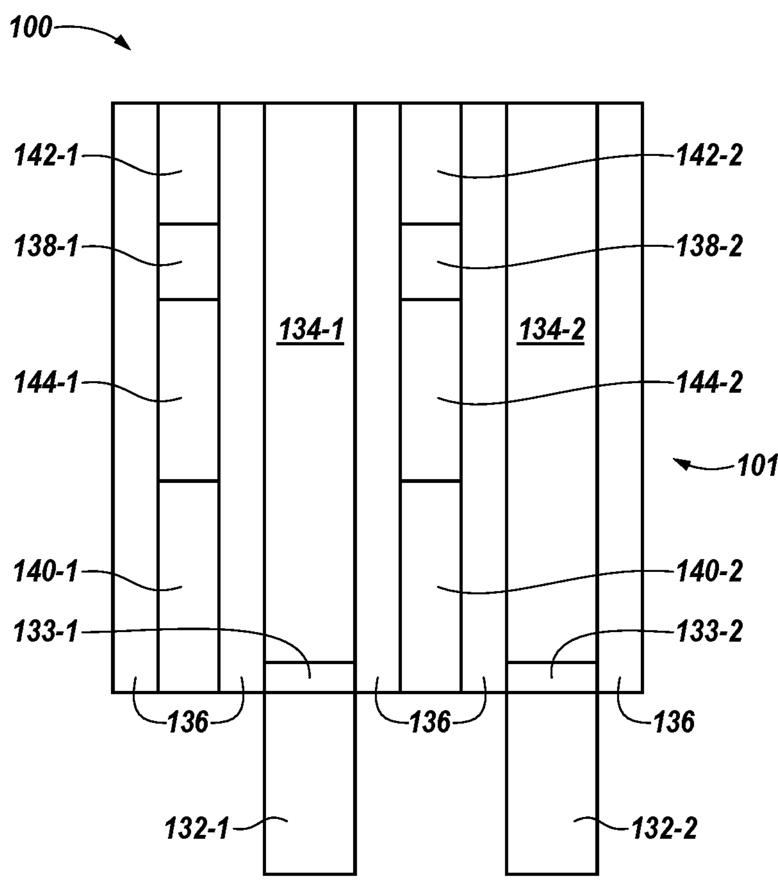
FIGS. 1A-6 illustrate cross-sectional views of a portion of a semiconductor structure of a memory device in association with a semiconductor fabrication sequence formation of a semiconductor structure in accordance with a number of embodiments of the present disclosure.

The present disclosure includes apparatuses, methods, and systems for a semiconductor structure with nitride caps. The semiconductor structure including nitride caps can be formed via a redistribution layer (RDL) damascene flow. A RDL damascene flow can be used for an RDL layer. The RDL layer can be formed on and enclosing a first surface of the semiconductor die and thereby form the semiconductor structure with nitride caps.

Various materials may be deposited using techniques such as chemical vapor deposition (CVD), plasma deposition, etc.

The deposited materials can be patterned using techniques such photolithographic techniques and/or doping techniques and/or can be etched using wet and/or dry etch (e.g., vapor) processes to form a semiconductor structure. Such semiconductor structures may contain, or be associated with, various materials that contribute to data access, storage, and/or processing, or to various support structures, on the memory device. As an example, a capacitor material may be deposited into an opening in a semiconductor structure to permit data access, storage, and/or processing use of the semiconductor structure including the capacitor material.

Semiconductor support structures are typically formed with spacers and sacrificial materials. Spacers may be associated with a storage node and/or a capacitor material. In some previous approaches, spacers may have been formed with low-K dielectric material, an oxide material, and/or a nitride material. However, forming a spacer with only these materials may cause damage to the semiconductor structure, for instance, damage during formation of the semiconductor structure. For example, using only a combination of a low-K dielectric material, an oxide material, and a nitride material for a spacer may cause electrical shorts and/or tapering of a semiconductor structure such as a digit line during formation of the semiconductor structure (e.g., during a cleaning process). The electrical short and/or tapering may hinder memory device performance for instance by reducing the functionality and/or the reliability of the memory device.

In contrast, in order to mitigate the above issues, a semiconductor structure with nitride caps is described herein. As an example, a nitride cap may be formed over the spacer (e.g., the low-K dielectric material, the oxide material, and the nitride material) to provide added protection during cleaning processes. The nitride cap can assist in preventing the digit line contact from tapering or incurring damage when a cleaning of the digit line is performed. This can be accomplished by using an RDL damascene process to add an additional nitride cap over the spacer material. Stated differently, the RDL damascene process can form nitride cap over the existing spacer material to provide additional protection.

For example, the third nitride material, a portion of the first dielectric material, a portion of the first nitride material can be removed (e.g., etched) to provide an opening for the nitride cap. The material for the nitride cap can be deposited in the opening to provide added protection for the spacer. Thereby, creating a protective surface for the spacer during cleaning processes. For instance, as detailed herein, the nitride cap (e.g., first portion of the second nitride material) can have a height from 5.0 nanometers (nm) to about 20 nm to provide additional protection. As such, approaches herein with nitride caps can provide added protection to the semiconductor structure during a cleaning process to prevent electrical shorts and tapering of sections in the semiconductor structure.

The present disclosure includes methods, apparatuses, and systems related to semiconductor structure with curved surfaces. An example semiconductor structure including a patterned material including a plurality of active areas and a first metal material on a surface of each active area. The patterned materials also include a second conductive material, a third conductive material, and a first dielectric material, wherein the first dielectric material is on a surface of the third conductive material and the third conductive material is on a surface of the second conductive material; and a first nitride material adjacent each vertical side of the second conductive material, the third conductive material, and the first dielectric material. The semiconductor structure further includes a second nitride material on a first horizontal surface of each first nitride material and each first dielectric material, and a second metal material.

In the following detailed description of the present disclosure, reference is made to the accompanying drawings that form a part hereof, and in which is shown by way of illustration how one or more examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure. As used herein, "a number of" something can refer to one or more such things. For example, a number of capacitors can refer to at least one capacitor.

The FIGURES herein follow a numbering convention in which the first digit or digits correspond to the figure number of the drawing and the remaining digits identify an element or component in the drawing. Similar elements or components between different FIGURES may be identified by the use of similar digits. For example, reference numeral 248 may reference element "48" in FIG. 2, and a similar element may be referenced as 348 in FIG. 3. In some instances, a plurality of similar, but functionally and/or structurally distinguishable, elements or components in the same figure or in different FIGURES may be referenced sequentially with the same element number (e.g., 103-1, 103-2, 103-3 in FIG. 1A).

FIG. 1A illustrates a cross-sectional view of a portion of a semiconductor structure 100 of a memory device in association with a semiconductor fabrication sequence formation of a semiconductor structure in accordance with a number of embodiments of the present disclosure. The example patterned material 101 is shown to have been formed as a part of a redistribution layer (RDL). The RDL may electrically connect one part of a semiconductor package to another. The patterned material 101 may include active areas 132 (individually referring to active area 132-1 and active area 132-2) and a first conductive material (individually referring to first conductive material 133-1 and first conductive material 133-2) and a first metal material 134 (individually referring to first metal material 134-1 and first metal material 134-2) on the surface of the active areas 132. The active areas 132 can be a silicon based active areas. The first conductive material 133 may be a cobalt monosilicide (CoSi) material. The metal material 134 may be tungsten (W), titanium (Ti), or a tungsten titanium polymer, among other possibilities.

The patterned material 101 may also include a second conductive material 140 (individually referring to second conductive material 140-1 and second conductive material 140-2), a third conductive material 144 (individually referring to third conductive material 144-1 and third conductive material 144-2), a first dielectric material 138 (individually referring to first dielectric material 138-1 and first dielectric material 138-2), a third nitride material 142 (individually referring to third nitride material 142-1 and third nitride material 142-2). The third nitride material 142 may be separated from the second conductive material 140 by the third conductive material 144 and the first dielectric material 138, and a plurality of first nitride material 136 separating each active area 132, each first conductive material 133, and each first metal material 134 from each second conductive material 140, third conductive material 144, first dielectric material 138, and third nitride material 142. In some embodiments, the second conductive material 140 may be deposited on the first side of the third conductive material 144 and the first dielectric material 138 and the third nitride material 142 on the second side of the third conductive material 144 to form a stacked layer. In some embodiments, a plurality of first nitride material 136 can separate a plurality of stacked layers from each active area 132, each first conductive material 133, and each first metal material 134.

The third conductive material 144 may serve as a digit line, the first metal material 134 may serve as a gate material, active areas 132 may serve as a source/drain region, the third nitride material 142 may serve as a dielectric material, while the second conductive material 140 may serve as an isolation material for the patterned material 101. In some embodiments, the second conductive material 140 may be formed from tungsten (W), titanium (Ti), or a tungsten titanium polymer, among other possibilities.

Third conductive material 144 may be a first metal material. For example, third conductive material 144 may be a tungsten (W) material or a titanium nitride (TiN) material. The first nitride material 136 may be a titanium nitride (TiN) material.

As used herein, the term "dielectric material" refers to and includes electrically insulative materials. Dielectric material, as discussed herein, may include, but is not limited to, one or more insulative oxide material or an insulative nitride material. A dielectric oxide may be an oxide material, a metal oxide material, or a combination thereof. The dielectric material may include, but is not limited to, a silicon oxide (SiOx), doped SiOx, phosphosilicate glass, borosilicate glass, borophosphosilicate glass, fluorosilicate glass, tetraethylorthosilicate (TEOS), silica carbon nitride (SiCN), silicon oxynitride (SiON), zirconium oxide carboxynitride material (e.g., SiOxCzNy), a combination thereof or a combination of one or more of the listed materials with silicon oxide.

Figure 1B:
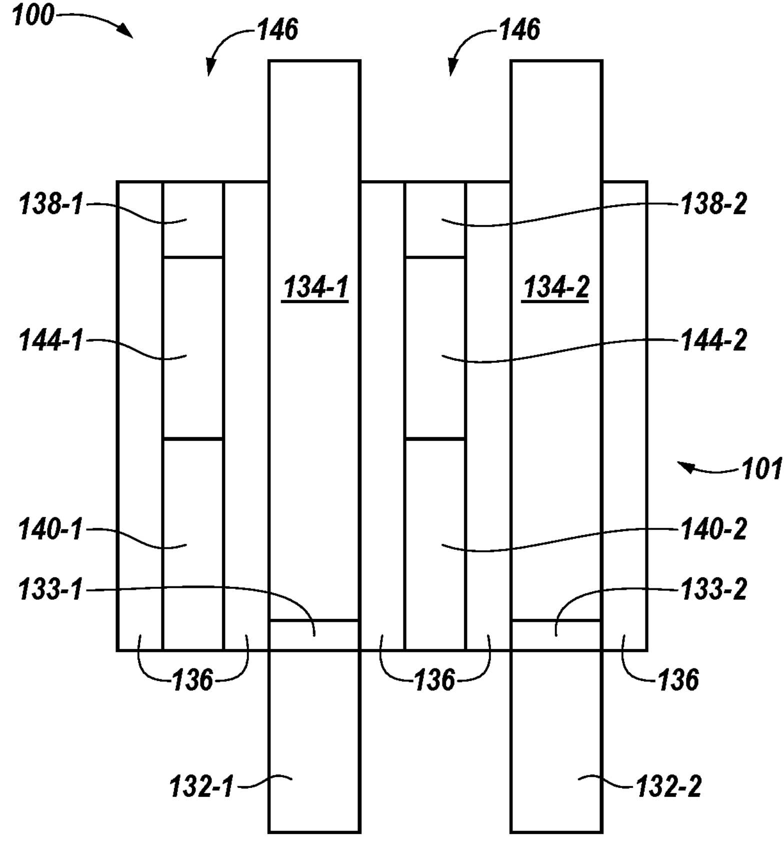

FIG. 1B illustrates a cross-sectional view of a portion of a semiconductor structure 100 of a memory device in association with a semiconductor fabrication sequence formation of a semiconductor structure in accordance with a number of embodiments of the present disclosure. FIG. 1B illustrates the example semiconductor structure at a particular stage following completion of the example fabrication sequence described in connection with FIG. 1A.

In the example embodiment shown in the example of FIG. 1B, the method comprises removing a portion of the first nitride material 136, third nitride material 142 of FIG. 1A, and a portion of the first dielectric material 138 to form a first vertical opening 146. The vertical opening 146 can expose the surface of the first dielectric material 138 and the sidewalls of the first metal material 134. In some embodiments, an etchant process may be used to form the first vertical opening 146 and expose the sidewalls of the first metal material 134.

Figure 2:
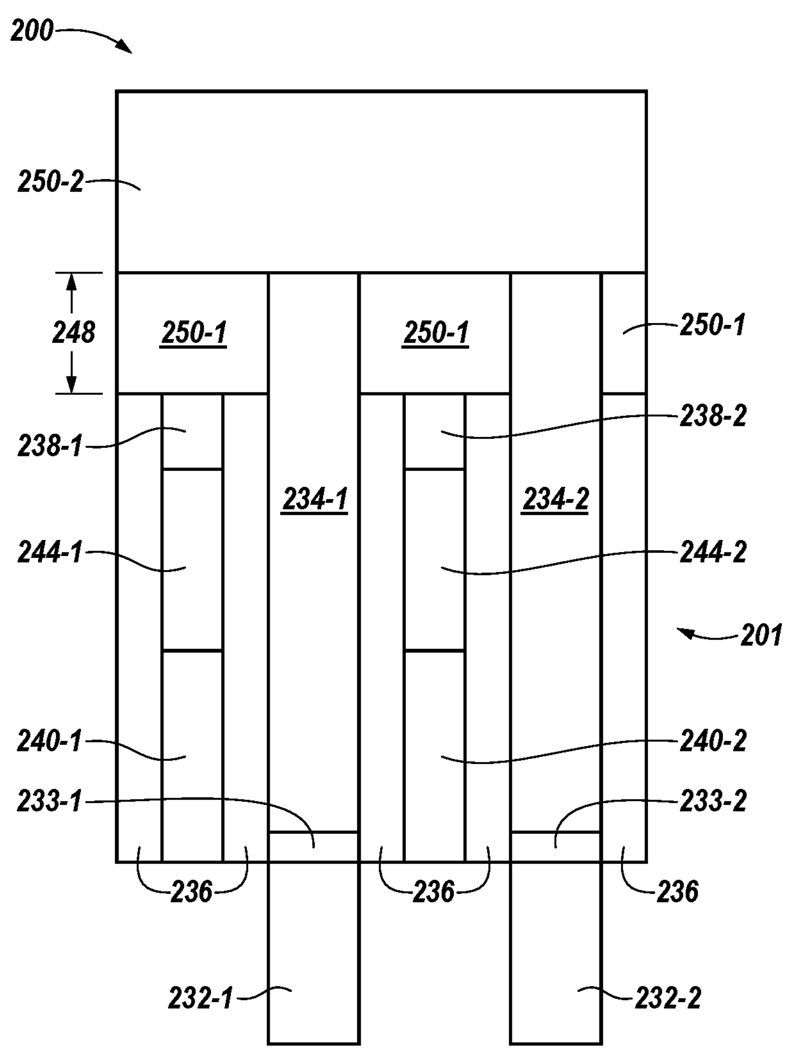

FIG. 2 illustrates a cross-sectional view of a portion of a semiconductor structure 200 of a memory device in association with a semiconductor fabrication sequence formation of a semiconductor structure in accordance with a number of embodiments of the present disclosure. FIG. 2 illustrates the example semiconductor structure at a particular stage following completion of the example fabrication sequence described in connection with FIGS. 1A-1B.

The semiconductor structure 200 may include the same or similar elements as the example semiconductor structure 100 as referenced in FIG. 1B. For example, the pattern of materials 201 is analogous or similar to pattern of materials 101. Active areas 232 (individually referring to active area 232-1 and active area 232-2) may be analogous or similar to active areas 132. First metal material 234 (individually referring to first metal material 234-1 and first metal material 234-2) may be analogous or similar to first metal material 134. Second conductive material 240 (individually referring to second conductive material 240-1 and second conductive material 240-2) may be analogous or similar to second conductive material 140. First dielectric material 238 (individually referring to first dielectric material 238-1 and first dielectric material 238-2) may be analogous or similar to first dielectric material 138. Third conductive material 244 (individually referring to third conductive material 244-1 and third conductive material 244-2) may be analogous or similar to third conductive material 144. First nitride material 236 may be analogous or similar to first nitride material 136.

In some embodiments, a second nitride material 250 may be formed in the first vertical opening 146 of FIG. 1B. The second nitride material 250 (individually referring to second nitride material 250-1 and second nitride material 250-2) may cover the exposed sidewalls of the first metal material 234 and the surface of the first nitride material 236 and the first dielectric material 238. The second nitride material 250 may be deposited according to a semiconductor fabrication process such as chemical vapor deposition (CVD), plasma deposition, atomic layer deposition (ALD), etc. Embodiments, however, are not limited to these example and other suitable semiconductor fabrication techniques may be used to deposit the second nitride material 250.

In some embodiments, the second nitride material 250 may include, but is not limited to, a titanium nitride (TiN), ($Ti_2N$), tungsten nitride (WN), $W_2N$, $WN_2$, W, or a combination of one or more of the listed materials.

In some embodiments, the second nitride material 250 may be broken into two portions (e.g., 250-1 and 250-2). A first portion to provide a cap to the stacked layer (e.g., second conductive material 240, third conductive material 244, and first dielectric material 238) and the first nitride material 236. In some embodiments, the first portion of the second nitride material 250-1 may be used as a digit line cap to protect the digit line from processes used to form the semiconductor structure 200. In some embodiments the first portion of the second nitride material 250-1 may have a height 248 from 5.0 nanometers (nm) to 20 nm. For example, the first portion of the second nitride material 250-1 may have a height 248 of at least 20 nm or 20 nm. In some embodiments, the first portion of the second nitride material 250-1 may end at the same level as the first metal material 234.

Figure 3:
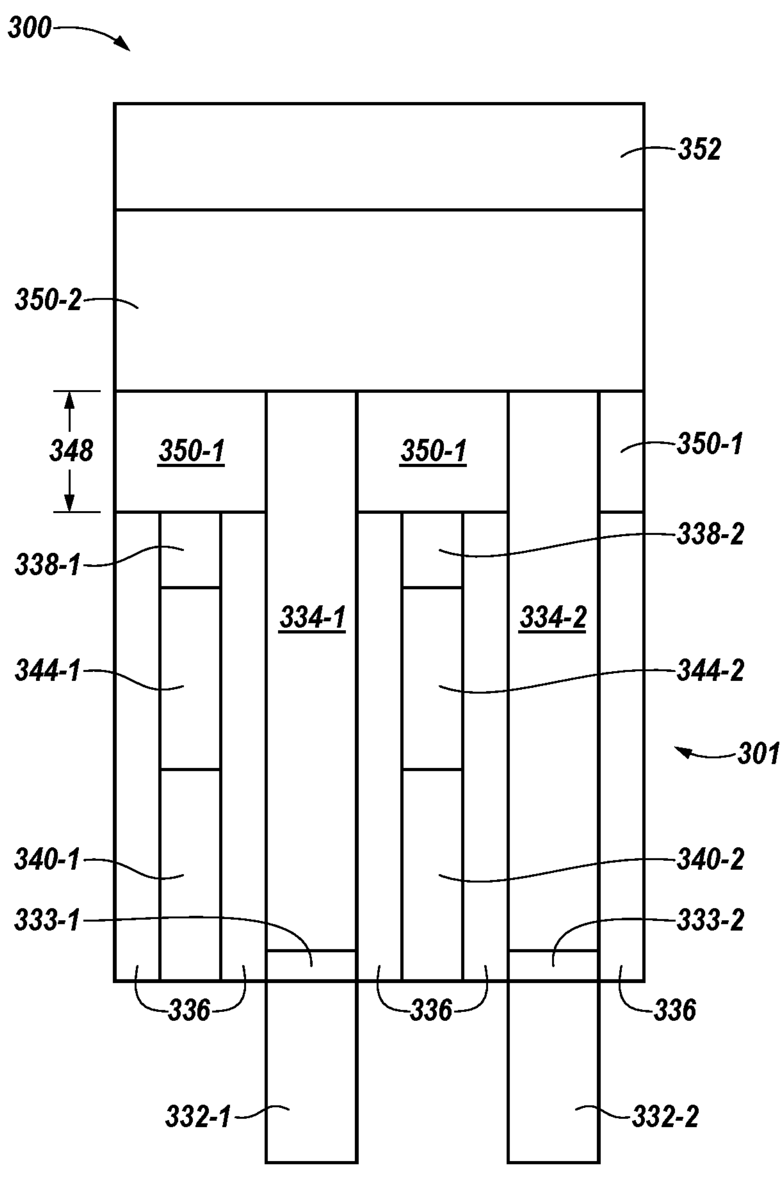

FIG. 3 illustrates a cross-sectional view of a portion of a semiconductor structure 300 of a memory device in association with a semiconductor fabrication sequence formation of a semiconductor structure in accordance with a number of embodiments of the present disclosure. FIG. 3 illustrates the example semiconductor structure at a particular stage following completion of the example fabrication sequence described in connection with FIG. 2.

The semiconductor structure 300 may include the same or similar elements as the example semiconductor structures 100 and 200 as referenced in FIGS. 1A-1B and 2. For example, the pattern of materials 301 is analogous or similar to pattern of materials 101 and 201. Active areas 332 (individually referring to active area 332-1 and active area 332-2) may be analogous or similar to active areas 132 and 232. First metal material 334 (individually referring to first metal material 334-1 and first metal material 334-2) may be analogous or similar to first metal material 134 and 234. Second conductive material 340 (individually referring to second conductive material 340-1 and second conductive material 340-2) may be analogous or similar to second conductive materials 140 and 240. First dielectric material 338 (individually referring to first dielectric material 338-1 and first dielectric material 338-2) may be analogous or similar to first dielectric materials 138 and 238. Third conductive material 344 (individually referring to conductive 344-1 and third conductive material 344-2) may be analogous or similar to third conductive materials 144 and 244. First nitride material 336 may be analogous or similar to nitride materials 136 and 236. Second nitride material 350 (individually referring to second nitride material 350-1 and second nitride material 350-2) may be analogous or similar to second nitride material 250.

As illustrated in FIG. 3, a carbon-based material 352 may be formed on the pattern of materials 301. The carbon-based material 352 may be deposited according to a semiconductor fabrication process such as chemical vapor deposition (CVD), plasma deposition, atomic layer deposition (ALD), etc. Embodiments, however, are not limited to these example and other suitable semiconductor fabrication techniques may be used to form the carbon-based material 352. The carbon-based material 352 may cover the second nitride material 350 deposited in the first vertical opening 146 of FIG. 1B. In one embodiment, carbon-based material 352 may be deposited to have a thickness in a range of twenty (30) nanometers (nm) to sixty (60) nm. Embodiments, however, are not limited to these examples.

Figure 4A:
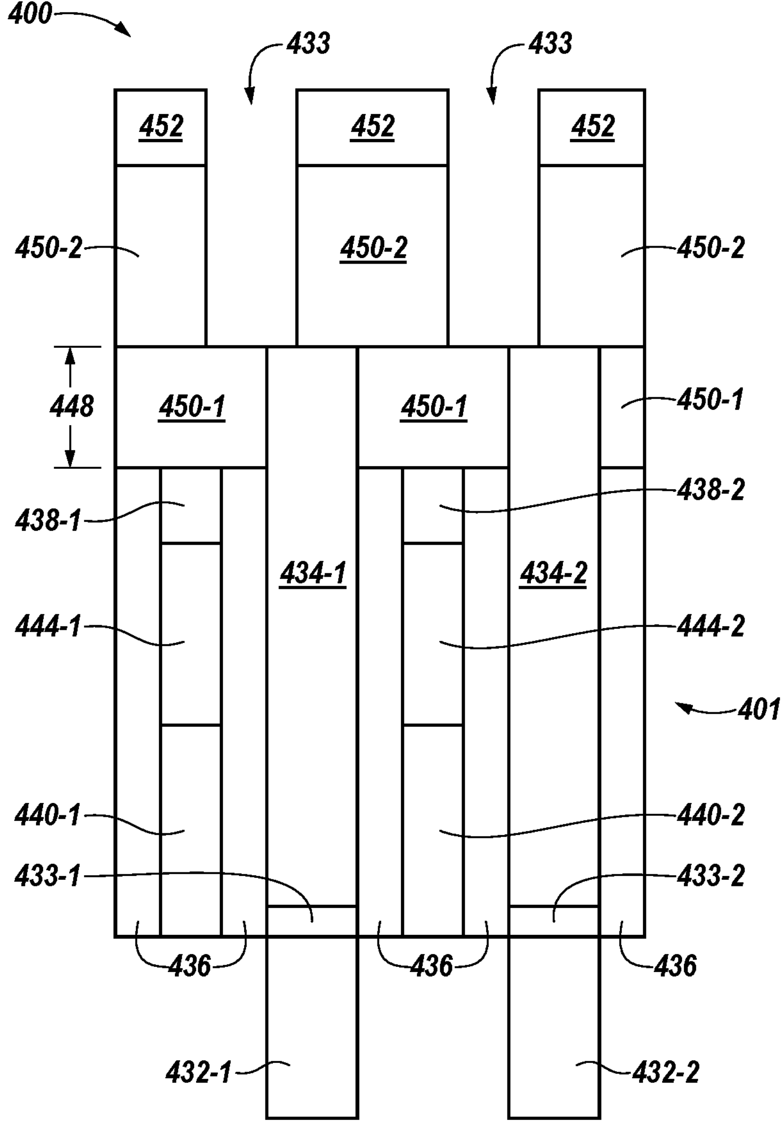

FIG. 4A illustrates a cross-sectional view of a portion of a semiconductor structure 400 of a memory device in association with a semiconductor fabrication sequence formation of a semiconductor structure in accordance with a number of embodiments of the present disclosure. FIG. 4A illustrates the example semiconductor structure at a particular stage following completion of the example fabrication sequence described in connection with FIG. 3.

The semiconductor structure 400 may include the same or similar elements as the example semiconductor structures 100, 200, and 300 as referenced in FIGS. 1A-1B, 2, and 3. For example, the pattern of materials 401 is analogous or similar to pattern of materials 101, 201, and 301. Active areas 432 (individually referring to active area 432-1 and active area 432-2) may be analogous or similar to active areas 132, 232, and 332. First metal material 434 (individually referring to first metal material 434-1 and first metal material 434-2) may be analogous or similar to first metal material 134, 234, and 334. Second conductive material 440 (individually referring to second conductive material 440-1 and second conductive material 440-2) may be analogous or similar to second conductive materials 140, 240, and 340. First dielectric material 438 (individually referring to first dielectric material 438-1 and first dielectric material 438-2) may be analogous or similar to first dielectric materials 138, 238, and 338. Third conductive material 444 (individually referring to conductive 444-1 and third conductive material 444-2) may be analogous or similar to third conductive materials 144, 244, and 344. First nitride material 436 may be analogous or similar to nitride materials 136, 236, and 336. Second nitride material 450 (individually referring to second nitride material 450-1 and second nitride material 450-2) may be analogous or similar to second nitride materials 250 and 350. Carbon-based material 452 may be analogous or similar to carbon-based material 352.

In some embodiments, the method comprises forming a second vertical opening 433 through a portion of the second nitride material 450 and the carbon-based material 452. For example, an etchant process may be used to remove portions of the second nitride material 450 and portions of the carbon-based material 452. The second vertical opening 433 may cause the second nitride material 450 to form a plurality of pillar like structures on the pattern of materials 401.

Figure 4B:
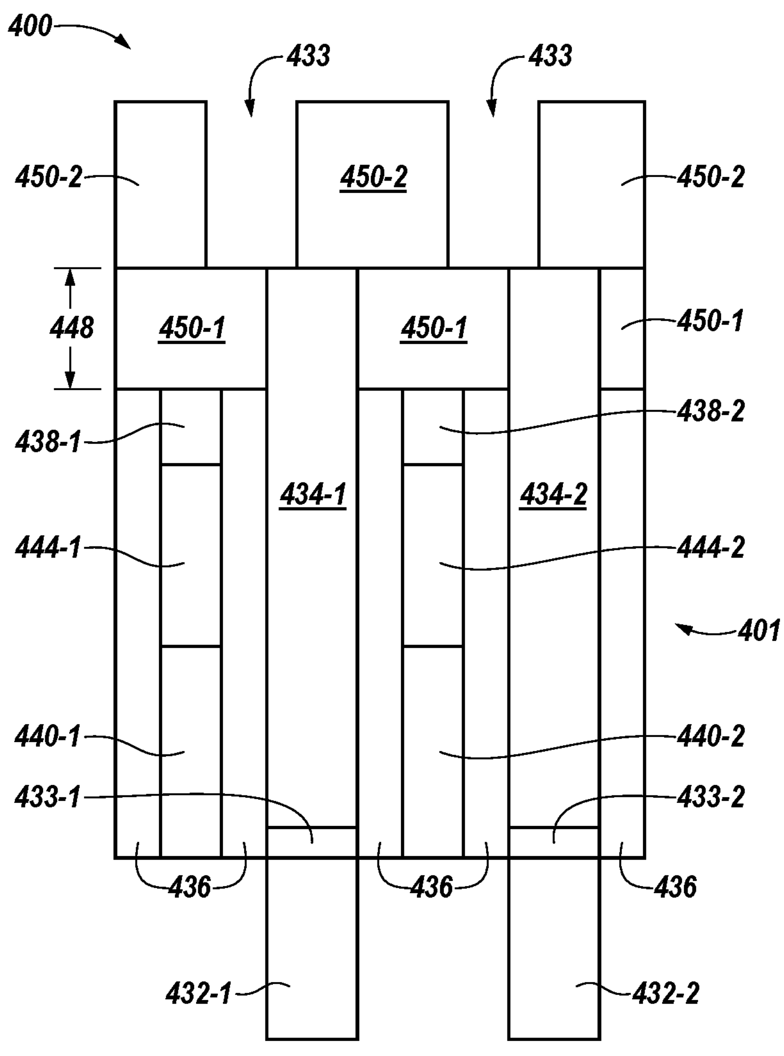

FIG. 4B illustrates a cross-sectional view of a portion of a semiconductor structure 400 of a memory device in association with a semiconductor fabrication sequence formation of a semiconductor structure in accordance with a number of embodiments of the present disclosure. FIG. 4B illustrates the example semiconductor structure at a particular stage following completion of the example fabrication sequence described in connection with FIG. 4A.

In some embodiments, the method comprises removing the carbon-based material 452 of FIG. 4A. For example, an etchant process may be used to remove the remaining the carbon-based material 452, illustrated in FIG. 4A, from the formation of the second vertical openings 433. In some embodiments, the carbon-based material 452 of FIG. 4A may be removed using an etchant process. For example, the method may comprise removing the carbon-based material using an etch selective to the carbon-based material.

Figure 5:
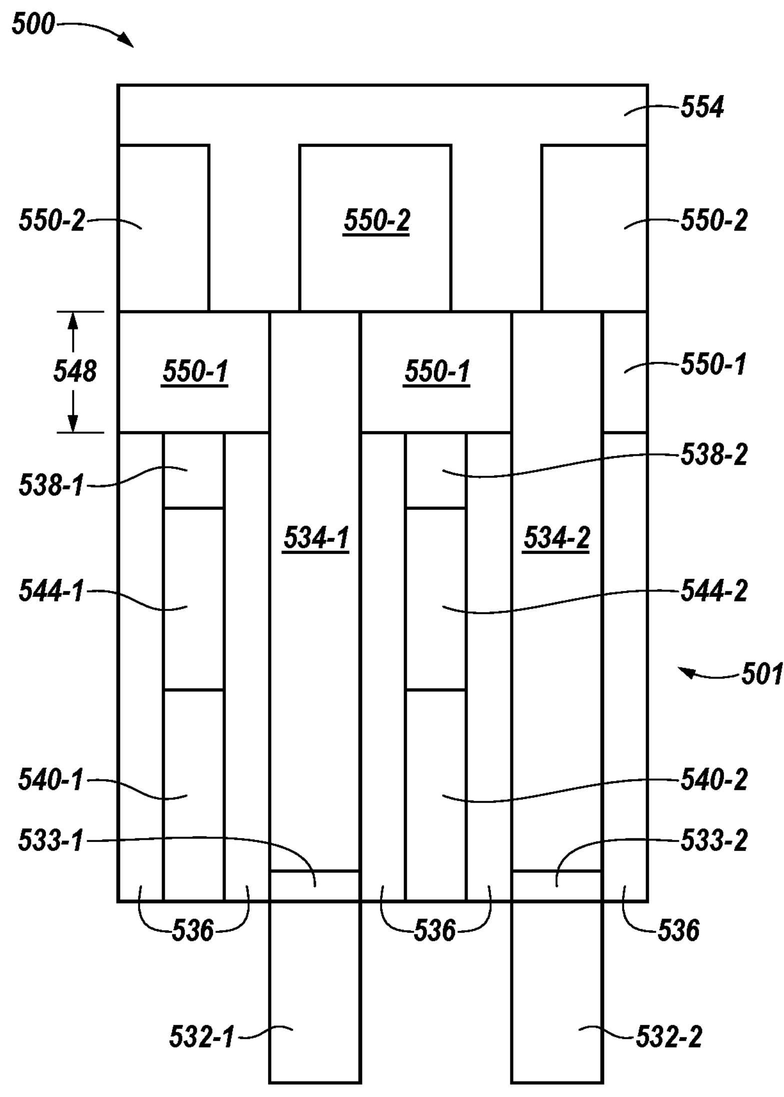

FIG. 5 illustrates a cross-sectional view of a portion of a semiconductor structure 500 of a memory device in association with a semiconductor fabrication sequence formation of a semiconductor structure in accordance with a number of embodiments of the present disclosure. FIG. 5 illustrates the example semiconductor structure at a particular stage following completion of the example fabrication sequence described in connection with FIGS. 4A-4B.

The semiconductor structure 500 may include the same or similar elements as the example semiconductor structures 100, 200, 300, and 400 as referenced in FIGS. 1A-1B, 2, 3, and 4A-4B. For example, the pattern of materials 501 is analogous or similar to pattern of materials 101, 201, 301 and 401. Active areas 532 (individually referring to active area 532-1 and active area 532-2) may be analogous or similar to active areas 132, 232, 332, and 432. First metal material 534 (individually referring to first metal material 534-1 and first metal material 534-2) may be analogous or similar to first metal material 134, 234, 334, and 434. Second conductive material 540 (individually referring to second conductive material 540-1 and second conductive material 540-2) may be analogous or similar to second conductive materials 140, 240, 340, and 440. First dielectric material 538 (individually referring to first dielectric material 538-1 and first dielectric material 538-2) may be analogous or similar to first dielectric materials 138, 238, 338, and 438. Third conductive material 544 (individually referring to third conductive material 544-1 and third conductive material 544-2) may be analogous or similar to third conductive materials 144, 244, 344, and 444. First nitride material 536 may be analogous or similar to nitride materials 136, 236, 336, and 436. Second nitride material 550 (individually referring to second nitride material 550-1 and second nitride material 550-2) may be analogous or similar to second nitride materials 250, 350, and 450.

In some embodiments, a second metal material 554 may formed in the second vertical openings 433 of FIG. 4B. The second metal material 554 may cover the exposed sides, created by the second vertical openings, of the second nitride material 550. In addition, as illustrated in FIG. 5, the second metal material 554 may be deposited on the surface of the second nitride material 550. The second metal material 554 may be deposited according to a semiconductor fabrication process such as chemical vapor deposition (CVD), plasma deposition, atomic layer deposition (ALD), etc. Embodiments, however, are not limited to these example and other suitable semiconductor fabrication techniques may be used to deposit the second metal material 554. In some embodiments, the second metal material 554 may include, but is not limited to, a tungsten (W), a titanium (Ti), or a tungsten titanium polymer, among other possibilities.

Figure 6:
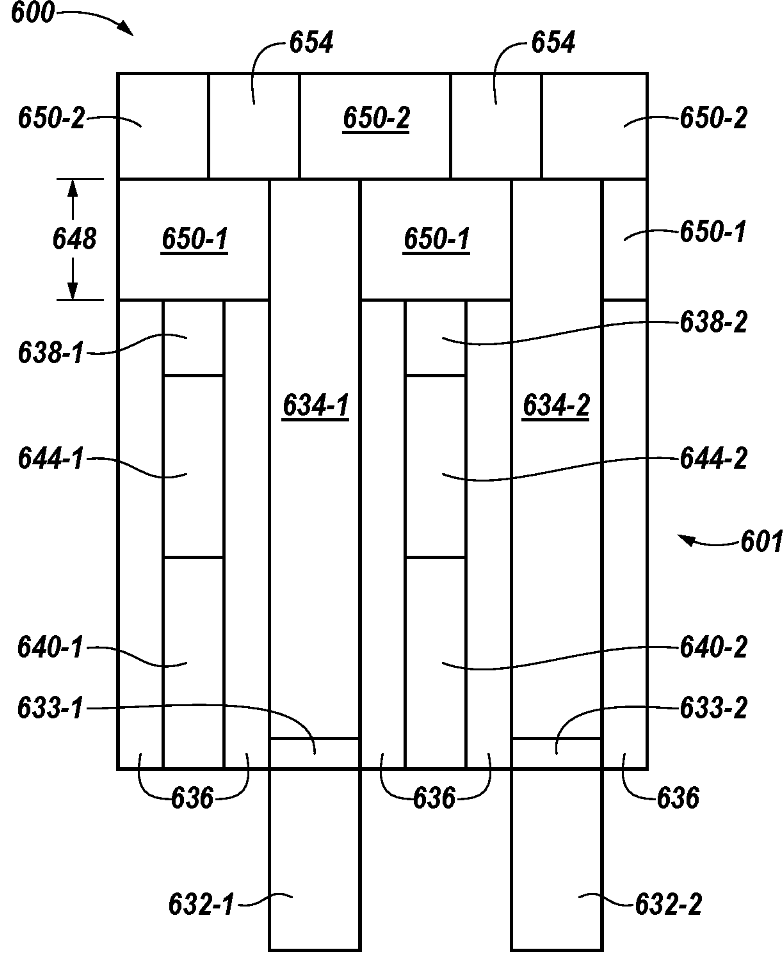

FIG. 6 illustrates a cross-sectional view of a portion of a semiconductor structure 600 of a memory device in association with a semiconductor fabrication sequence formation of a semiconductor structure in accordance with a number of embodiments of the present disclosure. FIG. 6 illustrates the example semiconductor structure at a particular stage following completion of the example fabrication sequence described in connection with FIG. 5.

The semiconductor structure 600 may include the same or similar elements as the example semiconductor structures 100, 200, 300, 400, and 500 as referenced in FIGS. 1A-1B, 2, 3, 4A-4B, and 5. For example, the patterned material 601 is analogous or similar to pattern of materials 101, 201, 301, 401, and 501. Active areas 632 (individually referring to active area 632-1 and active area 632-2) may be analogous or similar to active areas 132, 232, 332, 432, and 532. First metal material 634 (individually referring to first metal material 634-1 and first metal material 634-2) may be analogous or similar to first metal material 134, 234, 334, 434, and 534. Second conductive material 640 (individually referring to second conductive material 640-1 and second conductive material 640-2) may be analogous or similar to second conductive materials 140, 240, 340, 440, and 540. First dielectric material 638 (individually referring to first dielectric material 638-1 and first dielectric material 638-2) may be analogous or similar to first dielectric materials 138, 238, 338, 438, and 538. Third conductive material 644 (individually referring to third conductive material 644-1 and third conductive material 644-2) may be analogous or similar to third conductive materials 144, 244, 344, 444, and 544. First nitride material 636 may be analogous or similar to first nitride materials 136, 236, 336, 436, and 536. Second nitride material 650 (individually referring to second nitride material 650-1 and second nitride material 650-2) may be analogous or similar to second nitride materials 250, 350, 450 and 550.

In the example embodiment shown in the example of FIG. 6, the method comprises removing a portion of the second nitride material 650 and a portion of the second metal material 654. For example, the portion of the second nitride material 650 and the portion of the second metal material 654 may be removed using an etchant process. The removal process can form a layer including the second nitride material 650 and the second metal material 654 having a set height. For example, the second nitride material 650 and the second metal material 654 layer may be positioned on the patterned materials 601 and have a height of 30 nanometers (nm).

Figure 7:
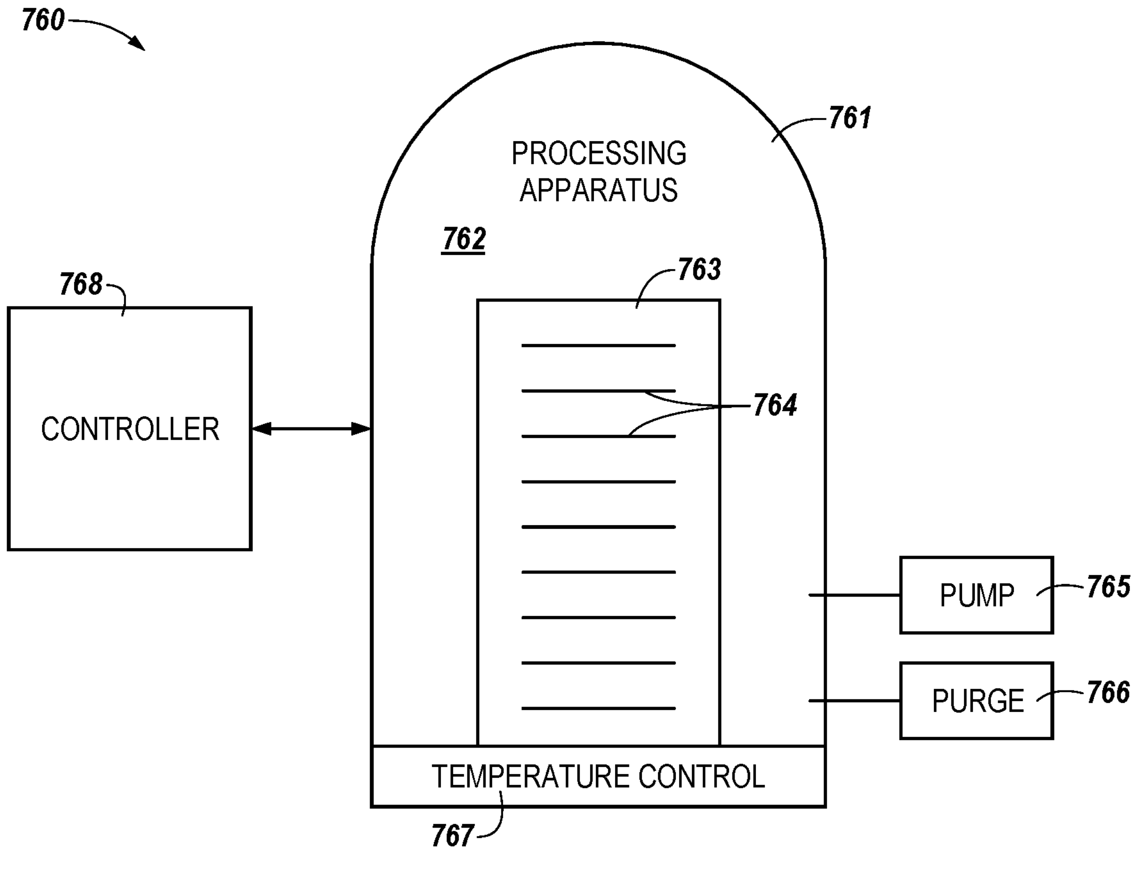
FIG. 7 is a functional block diagram of a system for implementation of an example semiconductor fabrication process in accordance with a number of embodiments of the present disclosure.

FIG. 7 is a functional block diagram of a system 760 for implementation of an example semiconductor fabrication process in accordance with a number of embodiments of the present disclosure. The system 760 can include a processing apparatus 761. The processing apparatus 761 can be configured to enable depositing a storage node material.

The processing apparatus 761 can include a semiconductor processing chamber 762 to enclose components configured to deposit a storage node material. The chamber 762 can further enclose a carrier 763 to hold a batch of semiconductor wafers 764. The processing apparatus 761 can include and/or be associated with tools including, for example, a pump 765 unit and a purge 766 unit configured to introduce and remove reactants. In one example, the reactants may include precursors/reducing agents. The processing apparatus 761 can further include a temperature control 767 unit configured to maintain the chamber 762 at appropriate temperatures as described herein.

The system 760 can further include a controller 768. The controller 768 can include, or be associated with, circuitry and/or programming for implementation of, for instance, depositing a storage node material. Adjustment of such deposition and purging operations by the controller 768 can control the thickness of the materials described herein.

The controller 768 can, in a number of embodiments, be configured to use hardware as control circuitry. Such control circuitry may, for example, be an application specific integrated circuit (ASIC) with logic to control fabrication steps, via associated deposition and purge processes, for depositing a storage node material.

Figure 8:
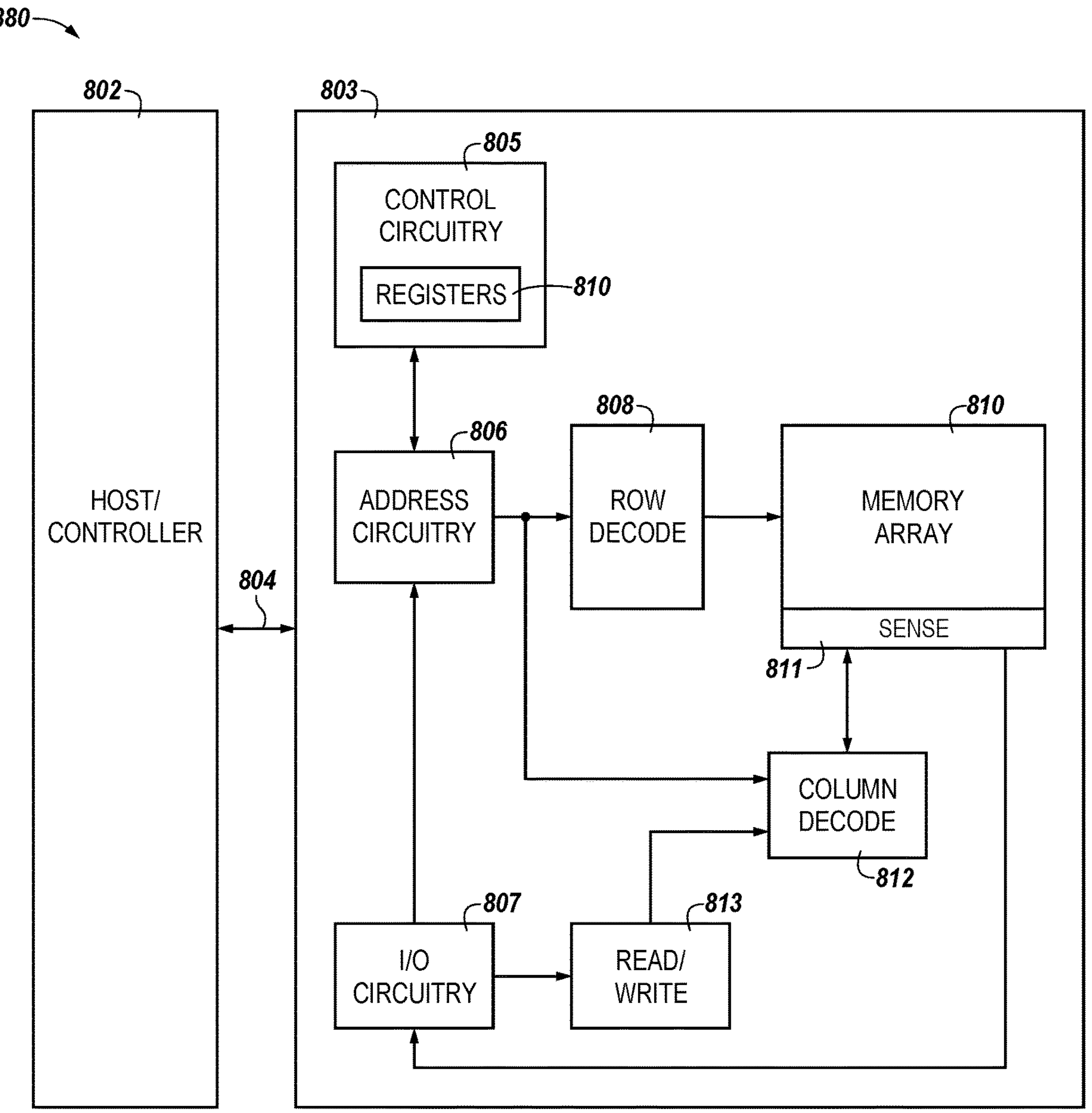
FIG. 8 illustrates a functional block diagram of an apparatus in the form of a computing system including a semiconductor structure of a memory system in accordance with a number of embodiments of the present disclosure

FIG. 8 is a block diagram of an apparatus in the form of a computing system 880 including a memory device 803 in accordance with a number of embodiments of the present disclosure. As used herein, a memory device 803, a memory array 810, and/or a host 802, for example, might also be separately considered an "apparatus." According to embodiments, the memory device 803 may comprise at least one memory array 810 with a memory cell formed having a digit line and body contact, according to the embodiments described herein.

In this example, system 880 includes a host 802 coupled to memory device 803 via an interface 804. The computing system 880 can be a personal laptop computer, a desktop computer, a digital camera, a mobile telephone, a memory card reader, or an Internet-of-Things (IOT) enabled device, among various other types of systems. Host 802 can include a number of processing resources (e.g., one or more processors, microprocessors, or some other type of controlling circuitry) capable of accessing memory 803. The system 880 can include separate integrated circuits, or both the host 802 and the memory device 803 can be on the same integrated circuit. For example, the host 802 may be a system controller of a memory system comprising multiple memory devices 803, with the system controller 805 providing access to the respective memory devices 803 by another processing resource such as a central processing unit (CPU).

In the example shown in FIG. 8, the host 802 is responsible for executing an operating system (OS) and/or various applications (e.g., processes) that can be loaded thereto (e.g., from memory device 803 via controller 805). The OS and/or various applications can be loaded from the memory device 803 by providing access commands from the host 802 to the memory device 803 to access the data comprising the OS and/or the various applications. The host 802 can also access data utilized by the OS and/or various applications by providing access commands to the memory device 803 to retrieve said data utilized in the execution of the OS and/or the various applications.

For clarity, the system 880 has been simplified to focus on features with particular relevance to the present disclosure. The memory array 810 can be a DRAM array comprising at least one memory cell having a digit line and body contact formed according to the techniques described herein. For example, the memory array 810 can be a 4F2 array. The array 810 can comprise memory cells arranged in columns coupled by word lines (which may be referred to herein as access lines or select lines) and rows coupled by digit lines (which may be referred to herein as sense lines or data lines). Although a single array 810 is shown in FIG. 8, embodiments are not so limited. For instance, memory device 803 may include a number of arrays 810 (e.g., a number of banks of DRAM cells).

The memory device 803 includes address circuitry 806 to latch address signals provided over an interface 804. The interface can include, for example, a physical interface employing a suitable protocol (e.g., a data bus, an address bus, and a command bus, or a combined data/address/command bus). Such protocol may be custom or proprietary, or the interface 804 may employ a standardized protocol, such as Peripheral Component Interconnect Express (PCIe), Gen-Z, CCIX, or the like. Address signals are received and decoded by a row decoder 808 and a column decoder 812 to access the memory array 810. Data can be read from memory array 810 by sensing voltage and/or current changes on the sense lines using sensing circuitry 811. The sensing circuitry 811 can comprise, for example, sense amplifiers that can read and latch a page (e.g., row) of data from the memory array 810. The I/O circuitry 807 can be used for bi-directional data communication with the host 802 over the interface 804. The read/write circuitry 813 is used to write data to the memory array 810 or read data from the memory array 810. As an example, the circuitry 813 can comprise various drivers, latch circuitry, etc.

Control circuitry 805 decodes signals provided by the host 802. The signals can be commands provided by the host 802. These signals can include chip enable signals, write enable signals, and address latch signals that are used to control operations performed on the memory array 810, including data read operations, data write operations, and data erase operations. In various embodiments, the control circuitry 805 is responsible for executing instructions from the host 802. The control circuitry 805 can comprise a state machine, registers 810, a sequencer, and/or some other type of control circuitry, which may be implemented in the form of hardware, firmware, or software, or any combination of the three. In some examples, the host 802 can be a controller external to the memory device 803. For example, the host 802 can be a memory controller which is coupled to a processing resource of a computing device.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

In the above detailed description of the present disclosure, reference is made to the accompanying drawings that form a part hereof, and in which is shown by way of illustration how one or more examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure.

It is to be understood that the terminology used herein is for the purpose of describing particular examples only and is not intended to be limiting. As used herein, the singular forms "a", "an", and "the" include singular and plural referents, unless the context clearly dictates otherwise, as do “a number of”, “at least one”, and “one or more” (e.g., a number of memory arrays may refer to one or more memory arrays), whereas a “plurality of” is intended to refer to more than one of such things. Furthermore, the words “can” and “may” are used throughout this application in a permissive sense (i.e., having the potential to, being able to), not in a mandatory sense (i.e., must). The term “include,” and derivations thereof, means “including, but not limited to”. The terms “coupled” and “coupling” mean to be directly or indirectly connected physically and, unless stated otherwise, can include a wireless connection for access to and/or for movement (transmission) of instructions (e.g., control signals, address signals, etc.) and data, as appropriate to the context.

While example examples including various combinations and configurations of semiconductor materials, underlying materials, structural materials, dielectric materials, capacitor materials, working surface materials, silicate materials, nitride materials, buffer materials, etch chemistries, etch processes, solvents, memory devices, memory cells, sidewalls of openings and/or trenches, among other materials and/or components related to stacking a semiconductor structure have been illustrated and described herein, examples of the present disclosure are not limited to those combinations explicitly recited herein. Other combinations and configurations of the semiconductor materials, underlying materials, structural materials, dielectric materials, capacitor materials, substrate materials, working surfaces, silicate materials, nitride materials, buffer materials, etch chemistries, etch processes, solvents, memory devices, memory cells, sidewalls of openings and/or trenches related to stacking a semiconductor structure than those disclosed herein are expressly included within the scope of this disclosure.

Although specific examples have been illustrated and described herein, those of ordinary skill in the art will appreciate that an arrangement calculated to achieve the same results may be substituted for the specific examples shown. This disclosure is intended to cover adaptations or variations of one or more examples of the present disclosure. It is to be understood that the above description has been made in an illustrative fashion, and not a restrictive one. Combination of the above examples, and other examples not specifically described herein will be apparent to those of skill in the art upon reviewing the above description. The scope of the one or more examples of the present disclosure includes other applications in which the above structures and processes are used. Therefore, the scope of one or more examples of the present disclosure should be determined with reference to the appended claims, along with the full range of equivalents to which such claims are entitled.

In the foregoing Detailed Description, some features are grouped together in an example for the purpose of streamlining the disclosure. This method of disclosure is not to be interpreted as reflecting an intention that the disclosed examples of the present disclosure have to use more features than are expressly recited in each claim. Rather, as the following claims reflect, inventive subject matter lies in less than all features of a disclosed example. Thus, the following claims are hereby incorporated into the Detailed Description, with each claim standing on its own as a separate example.

What is claimed is:

1. A semiconductor structure, comprising:

a patterned material comprising:

a plurality of active areas;

a first conductive material on a surface of each active area of the plurality of active areas;

a first metal material on a surface of each first conductive material;

a second conductive material, a third conductive material comprising a digit line material, and a first dielectric material, wherein the first dielectric material is on a surface of the third conductive material and the third conductive material is on a surface of the second conductive material;

a first nitride material adjacent each vertical side of the second conductive material, the third conductive material, and the first dielectric material; and a second nitride material on a first horizontal surface of each first nitride material and each first dielectric material to provide a nitride cap; and a second metal material.

2. The semiconductor structure of claim 1, wherein a first portion of the second nitride material has a height of at least 5.0 nanometers (nm).

3. The semiconductor structure of claim 1, wherein a first portion of the second nitride material has a height of at least 20 nm.

4. The semiconductor structure of claim 1, wherein the second conductive material is a tungsten (W), titanium (Ti), or a tungsten titanium alloy.

5. The semiconductor structure of claim 1, wherein the first dielectric material is a silica carbon nitride (SiCN), a silicon oxynitride (SiON), a silicon oxide (SiOx), a doped SiOx, a phosphosilicate glass, a borosilicate glass, a borophosphosilicate glass, a fluorosilicate glass, or a tetraethylorthosilicate (TEOS).

6. The semiconductor structure of claim 1, wherein the second conductive material is a titanium-based materials.

7. The semiconductor structure of claim 1, wherein the first metal material is a tungsten material.

8. A method of forming a semiconductor structure, comprising:

forming a patterned material comprising a plurality of active areas, a cobalt monosilicide (CoSi) material on a surface of each active area, a first metal material on a surface of each cobalt monosilicide (CoSi) material, a plurality of stacked layers including a second conductive material, a third conductive material, a first dielectric material, and a third nitride material, wherein the first dielectric material is on a surface of the third conductive material and the third conductive material is on a surface of the second conductive material, and a first nitride material separating each active area, each cobalt monosilicide (CoSi) material, and each first metal material from each stacked layer;

selectively removing a portion of the first nitride material, the third nitride material, and a portion of the first dielectric material to expose a plurality of sidewalls of the first metal material and create a first vertical opening;

depositing a second nitride material around the sidewalls of the first metal material and on a surface of the first nitride material and a surface of the first dielectric material to form a nitride cap;

depositing a carbon-based material on the second nitride material;

removing the carbon-based material and a first portion of the second nitride material to form a plurality of second vertical opening;

depositing a second metal material in the plurality of second vertical opening and on the surface of the second nitride material; and removing a second portion of the second nitride material and a portion of the first metal material.

9. The method of claim 8, comprising depositing the second nitride material with atomic layer deposition (ALD).

10. The method of claim 8, comprising forming the third nitride material as a dielectric material.

11. The method of claim 8, comprising depositing the third conductive material as a digit line material.

12. The method of claim 8, comprising selectively removing the portion of the first nitride material and the third nitride material a distance of 5 to 20 nanometers (nm).

13. A method of forming a semiconductor structure, comprising:

forming a patterned material comprising a plurality of active areas, a first conductive material on a surface of each active area, a first metal material on a surface of each first conductive material, a plurality of stacked layers including a second conductive material, a third conductive material, a first dielectric material, and a third nitride material, and a first nitride material adjacent each stacked layer;

selectively removing a portion of the first nitride material and the third nitride material to create a first vertical opening;

forming a second nitride material on a remaining portion of the first nitride material, the first dielectric material, and the first metal material to form a nitride cap;

removing a first portion of the second nitride material to form a plurality of second vertical openings;

depositing a second metal material in the plurality of second vertical openings; and etching a second portion of the second metal material and a portion of the second nitride material.

14. The method of claim 13, comprising depositing the third conductive material as a digit line material.

15. The method of claim 13, comprising etching the portion of the first nitride material a distance of 5 to 20 nanometers (nm).

16. The method of claim 13, further comprising forming the third nitride material as a dielectric material.

17. The method of claim 13, comprising depositing a carbon-based material on the second nitride material subsequent to forming the second nitride material.

18. The method of claim 13, comprising depositing the second metal material as a tungsten (W) material.

* * * * *